United States Patent
Keeney et al.

(10) Patent No.: US 6,697,282 B1
(45) Date of Patent: Feb. 24, 2004

(54) REFERENCE VOLTAGE GENERATOR EMPLOYING LARGE FLASH MEMORY CELLS COUPLED TO THRESHOLD TUNING DEVICES

(75) Inventors: Stephen N. Keeney, San Jose, CA (US); Kerry D. Tedrow, Folsom, CA (US); Krishna Kumar Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 524 days.

(21) Appl. No.: 09/676,583

(22) Filed: Sep. 29, 2000

(51) Int. Cl.[7] ................................ G11C 16/28
(52) U.S. Cl. .................. 365/185.2; 365/185.24; 365/185.33; 365/189.07; 365/189.09; 365/208; 365/210
(58) Field of Search ............... 365/185.2, 185.21, 365/185.24, 185.33, 189.09, 189.07, 190, 205, 207, 208, 210

(56) References Cited

U.S. PATENT DOCUMENTS

| | | | | |
|---|---|---|---|---|
| 5,418,743 A | * | 5/1995 | Tomioka et al. | 365/185.03 |
| 5,596,527 A | * | 1/1997 | Tomioka et al. | 365/185.03 |
| 5,764,097 A | * | 6/1998 | Whitfield | 327/540 |
| 6,219,290 B1 | * | 4/2001 | Chang et al. | 365/207 |
| 6,432,761 B1 | * | 8/2002 | Gerber et al. | 438/217 |

* cited by examiner

Primary Examiner—Andrew Q. Tran
(74) Attorney, Agent, or Firm—Blakely, Sokoloff, Taylor & Zafman LLP

(57) ABSTRACT

A reference voltage generator for a flash memory is described. Specifically, the memory cells used in implementing a reference voltage generator are increased in size to enable the generator to be less sensitive to temperature changes as well as device noise. The flash cells may be coupled to threshold tuning devices, which enable the threshold voltage to be easily trimmed.

15 Claims, 5 Drawing Sheets

REFERENCE VOLTAGE GENERATOR EMPLOYING LARGE FLASH MEMORY CELLS COUPLED TO THRESHOLD TUNING DEVICES

FIELD OF THE INVENTION

The present invention pertains to the field of flash memory. More particularly, the present invention relates to a reference voltage generating circuit that may be used in a flash memory.

BACKGROUND OF THE INVENTION

Flash memory is used in a wide variety of products including many types of computing, communication, and consumer electronic devices. Flash memory is a type of nonvolatile memory. Flash memory typically includes one or more memory arrays, each associated with a reference voltage generator. That reference voltage generator comprises two flash cells.

The memory arrays store data values and can be erased, read, and written to. When a read request is made on a particular memory cell within the memory array, the stored data is made available for further processing. This data is usually in the form of an analog signal. Thus, a sensing amplifier is used to detect and amplify this analog signal. The sensing amplifier detects the signal from the memory cell by comparing it to a voltage value from the voltage reference generator array. The reference voltage generator circuit 17 in FIG. 3 generates a reference value. This circuit 17 will be discussed in greater detail below. The reference voltage generator array 18 takes the output value from reference voltage generator circuit 17 and creates another voltage reference value to be used by the sensing circuit 16.

Conventionally, flash memory uses the same size flash memory cells for both the array and the reference voltage generator. FIG. 1 shows a standard flash cell layout used in a conventional reference generating circuit. The standard flash memory cell 10 has a gate width of approximately 0.3 um and a gate length of approximately 0.3 um. It is the same cell used throughout the flash memory array. The flash memory cells in a flash memory array are generally designed to be of minimal size in order to conserve chip die area. In a standard reference generating circuit, the threshold voltage of the device is dependant on factors such as the size of the device and chip process.

FIG. 2 shows a standard flash memory cell 10 configured for programming. The flash memory cell 10 includes select gate 11, which is connected to a programming voltage VG. Typical programming voltage VG for prior flash memory cells is 12.0 volts supplied by a programming supply VDD. The flash memory cell 10 also includes floating gate 12, a source 13, and a drain 14, wherein the source 13 and the drain 14 are formed in substrate 15. Both the select gate 11 and floating gate 12 have a width of approximately 0.3 um and a length of approximately 0.3 um as previously mentioned. The memory cell essentially acts as a field effect transistor ("FET") having a threshold voltage Vt that is variable according to the amount of charge stored on the floating gate 12.

Applying the programming voltage VG to the select gate 11 switches the FET of the flash memory cell 10 on, causing current to flow from the drain 14 to the source 13. The programming voltage VG also creates a "vertical" electric field between the substrate 15 and the floating gate 12. Electron flow in the vertical electric field is depicted as an arrow having its head at floating gate 12 and its tail at substrate 15. This substantially shows the direction of electron flow in the vertical electric field. As shown, the source 13 is coupled to system ground VSS, and the drain 14 is coupled to a drain voltage VDD. The difference in potential between the drain 14 and the source 13 creates a "horizontal" electric field that accelerates electrons from the source 13 across the channel towards the drain 14. For one embodiment, it is sufficient for VDD to be 5–7 volts greater than the voltage at source 13. Electron flow in the horizontal electric field is shown as an arrow having its head at drain 14 and its tail at source 13. This substantially shows the direction of electron flow across the channel. The accelerated or "hot" electrons collide with the lattice structure of substrate 15, and some of the hot electrons are swept onto the floating gate by the vertical electric field. In this manner, the amount of charge stored on the floating gate may be increased. The flash memory cell 10 is capable of achieving two or more analog states.

As the flash memory cells 10 for the array are reduced in size, so are the flash memory cells used to make the reference voltage generator. As those cells shrink, however, noise and variation in the process used to fabricate the device may cause the reference voltage generator to perform in an unacceptable manner.

Process variation and/or noise can decrease predictability of the signals generated by the reference voltage generators. This is undesirable given that analog circuits that receive those signals can be highly sensitive to an offset in reference voltage value. For example, if an offset reference voltage is fed to a sensing amplifier, the circuit may read the analog signal and erroneously detect the wrong value resulting in a read failure. In addition, an inaccurate reference voltage may cause excess delay through the sensing circuit leading to read speed failure. Programming time of memory devices may also suffer due to an offset in reference voltage value.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A reference voltage generator for a flash memory that is less immune to noise and process variation is described. Specifically, standard flash memory cells that comprise a reference voltage generator are redesigned for stability. A reference voltage generator comprises two redesigned standard flash memory cells with tuning devices and other components. The voltage threshold levels of the flash memory cells may be tuned using auxiliary devices.

Figure 3:
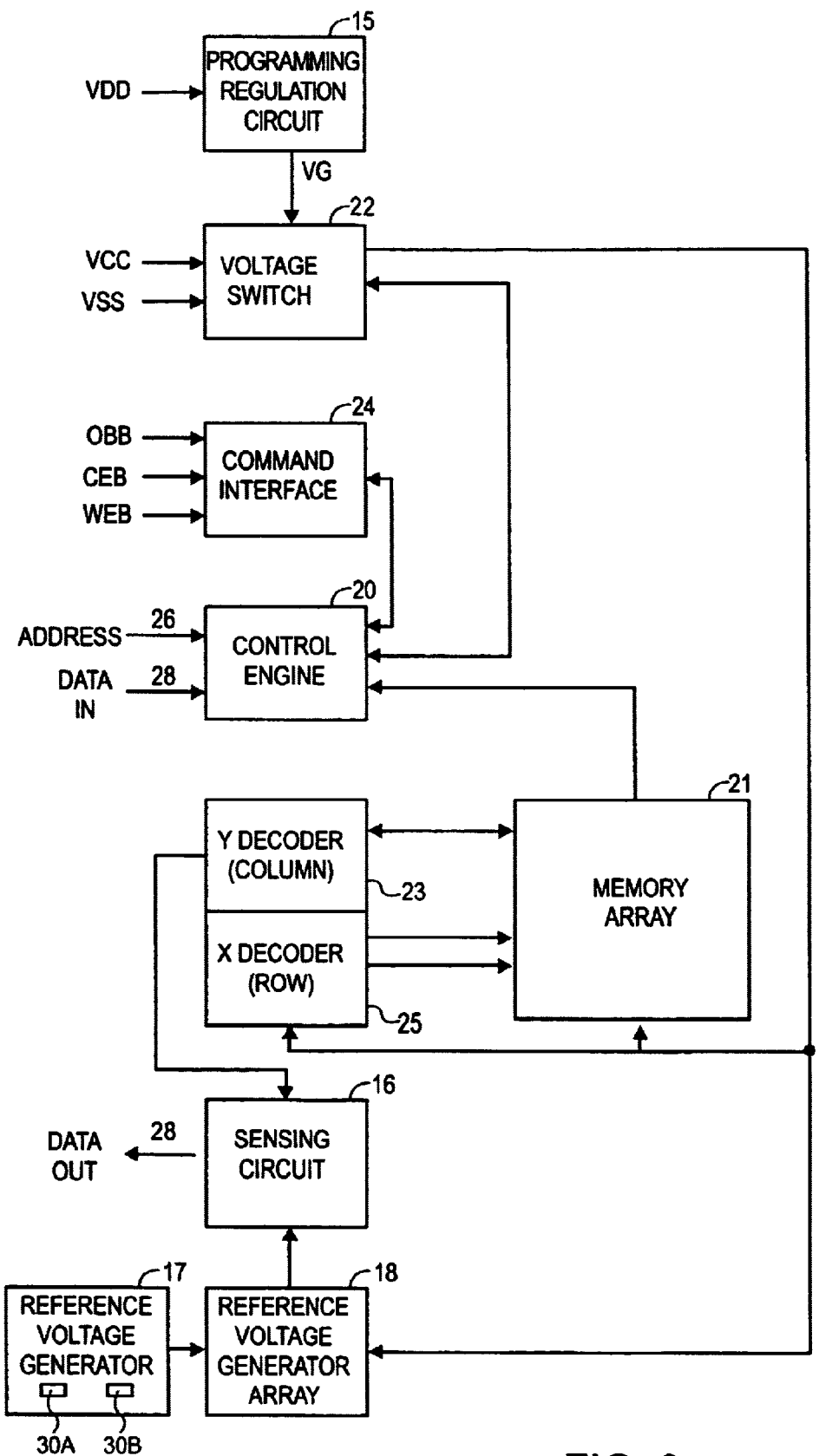
FIG. 3 shows a nonvolatile memory device including a programming voltage regulation circuit.

FIG. 3 is a block diagram of a flash memory device that includes an array of reference voltage generator 17, reference voltage generator array 18, memory array 21, X decoder 25, Y decoder 23, sensing circuitry 16, control engine 20, voltage switch 22, command interface 24, and programming regulation circuit 15. The reference voltage generator circuit, whose output is subsequently used to create other reference voltages to be used throughout the chip, will be described in further detail below.

Users provide addresses to the memory device via address lines 26 and receive data from the memory device via data lines 28. The memory device stores data using nonvolatile memory cells within memory array 21. The threshold voltages of the nonvolatile memory cells can be altered during programming, thus permitting storage of analog voltage levels. Memory array 21 may include any type of memory cell with programmable threshold voltages, such as memory cells with trapping dielectrics of floating gates. In one embodiment, memory array 21 is comprised of flash memory cells that each is capable of achieving two or more analog states.

To read data stored in the memory array 21, X decoder 25, and Y decoder 23 select a number of memory cells of the memory array 21 in response to a user-provided address received via address lines 26. X decoder 25 selects the appropriate row within memory array 21. For this reason, X decoder 25 is also called row decoder 25. Similarly, Y decoder 23 selects the appropriate column within memory array 21. Because of its function, Y decoder 23 is also called column decoder 23.

Data output from memory array 21 is coupled to Y decoder 23, which passes the data on to sensing circuitry 16. Sensing circuitry 16 compares the states of the selected memory cells to the voltage reference values of array 18. The array of voltage reference values are generated using the output of the reference voltage generator 17. Sensing circuitry 16 includes sensing amplifiers, or differential comparators, that output digital logic voltage levels in response to the comparisons between memory cells and reference cells. In this manner, the analog states of the memory cells are expressed and output as digital data.

Control engine 20 manages memory array 21 via control of row decoder 25, column decoder 23, sensing circuitry 16, voltage reference generator array 18, voltage switch 22, and programming voltage regulation circuit 15. Voltage switch 22 controls the various voltage levels necessary to read, and erase memory array 21, and also supplies a drain voltage VDD for programming. The programming voltage regulation circuit 15 provides the select gate voltages for programming.

User commands for reading, erasure, and programming are communicated to control engine 20 via command interface 24 from an external microprocessor (not shown). The external user issues commands to command interface 24 via three control pins: output enable OEB, write enable WEB, and chip enable CEB.

The control engine 20 controls the application of voltages to the flash memory cell using one or more "programming pulses" to program the flash memory cell. A programming pulse is a fixed length of time during which the programming voltage VG and the drain voltage VDD are applied. A "programming cycle" is a maximum time allowed by a particular programming algorithm to program a flash memory cell. Several programming pulses are typically included in a single programming cycle.

Figure 4:
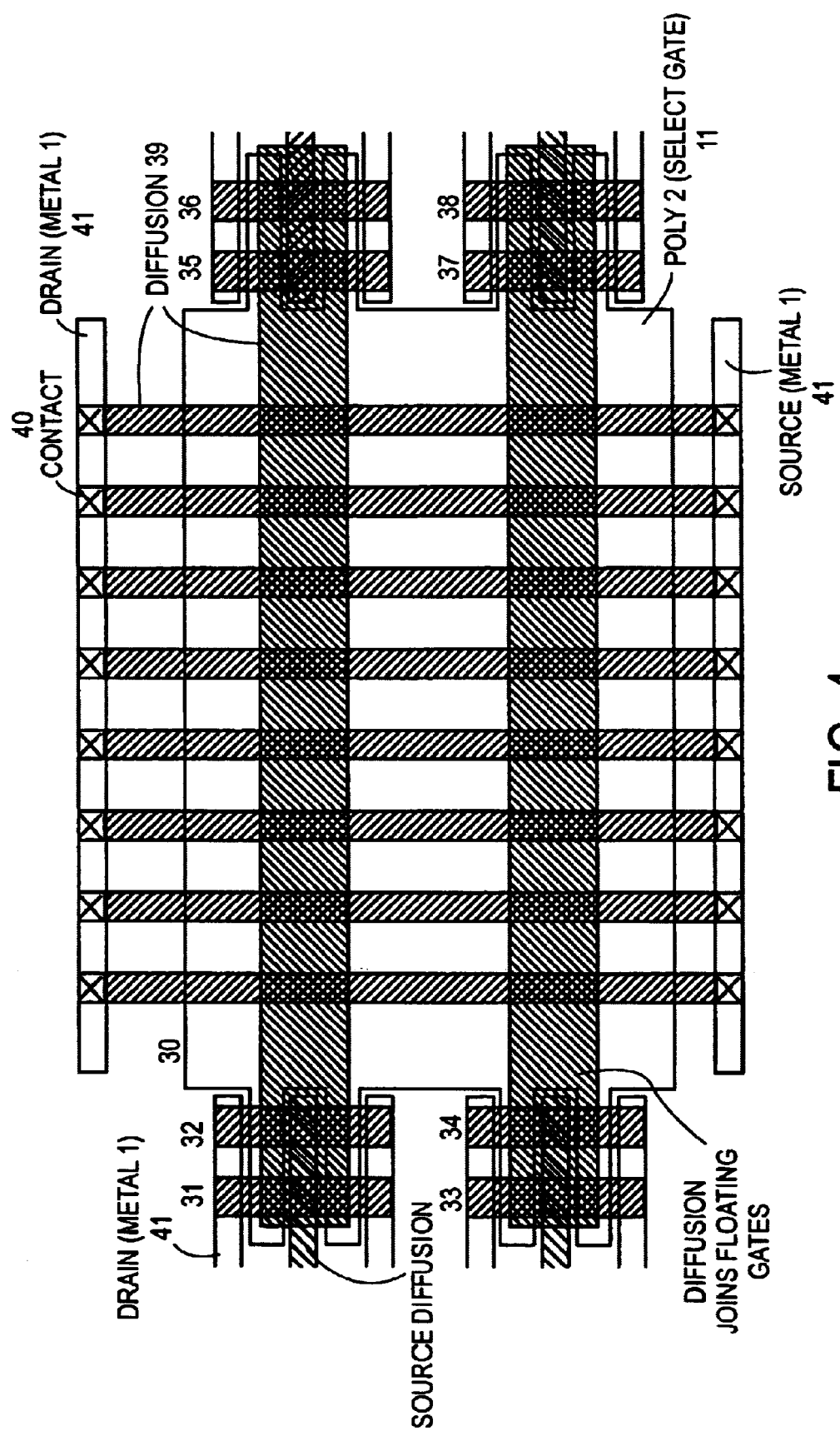
FIG. 4 shows a flash memory cell with threshold tuning devices.

The reference voltage generator 17 consists of two large flash memory cells 30A and 30B. FIG. 4 shows flash memory cell 30A, which is one of the two large flash memory cells in reference voltage generator 17. The other flash memory cell 30B is similar to memory cell 30A. Flash memory tuning devices 31, 32, 33, 34, 35, 36, 37, and 38 are associated with large flash cell 30A. The tuning devices 31–38 are auxiliary cells connected to the flash memory cell 30A through floating gates. Flash memory cell 30B also has associated tuning devices.

A regular flash memory cell 10 has no such tuning devices. Moreover, note that the standard flash memory cell 10 is much smaller in dimension than the large flash memory cell 30A. For one embodiment, flash memory cell 30A with tuning devices has a gate width of approximately 5 um and a gate length of approximately 5 um. The flash memory cell 30A is used to minimize the quantum effects, which tend to be magnified in the very small devices found in the memory array. Quantum effects show up in the form of random telegraph signal noise, which may make the current through the device particularly unpredictable. Flash memory cell 30A deals with this problem by increasing the channel length. Long cells reduce noise as shown by equation (1):

$$\text{noise } \alpha 1/(L^2), \qquad \text{equation 1}$$

where L is the effective length of the device.

Nevertheless, increasing the channel length of the device creates two other problems. The first relates to decreased current through the device according to equation (2):

$$\text{current } \alpha(W/L), \qquad \text{equation 2}$$

where W is the device width and L is the device length. Decreased current will affect the read speed of the flash memory cell. From equation (2), it can be seen that increasing the device width will increase the flow of current through the device. The chosen device width to device length ratio of the enlarged flash memory cell 30A should be similar to the device width to device length ratio of the standard flash memory cell 10 to guarantee similar timing results.

The second problem that results from an increased device length is programming speed. Larger flash memory cells take longer periods of time to charge. Hence, auxiliary devices 31–38 are used to improve programming speed. The threshold tuning devices 31–38 are used to charge the flash memory cell 30A through the shared floating gate, setting the threshold voltage Vt of the flash memory cell 30A. Each of the threshold tuning devices 31–38 are equal in size with a gate length of approximately 0.35 microns and a gate width of approximately 0.35 microns. When any one of the threshold tuning devices 31–38 is charged, the flash memory cell is simultaneously charged through the floating gate. The charging and erasing speed of the flash memory cell 30A may be increased through increasing the number of the threshold tuning devices. After the flash memory cell 30A has been properly programmed, the threshold tuning devices 31–38 may then be disabled.

The self-aligned polysilicon process used to implement the layout for this invention requires a creative solution of how to share the floating gates of the threshold tuning devices 31–38 with the floating gate of the large flash memory cell 30A. In the layout, strips of diffusion 39 run parallel as shown in FIG. 4. They are connected through contacts 40 to a first metal layer 41 to form a source and drain for the large flash memory cell. The auxiliary cells 31–38 are located on the outer boundary of the large flash memory cell. The auxiliary cells also have a drain 42 and source 39. Note the source 39 of the auxiliary cell is diffusion rather than a first layer metal.

Figure 1:
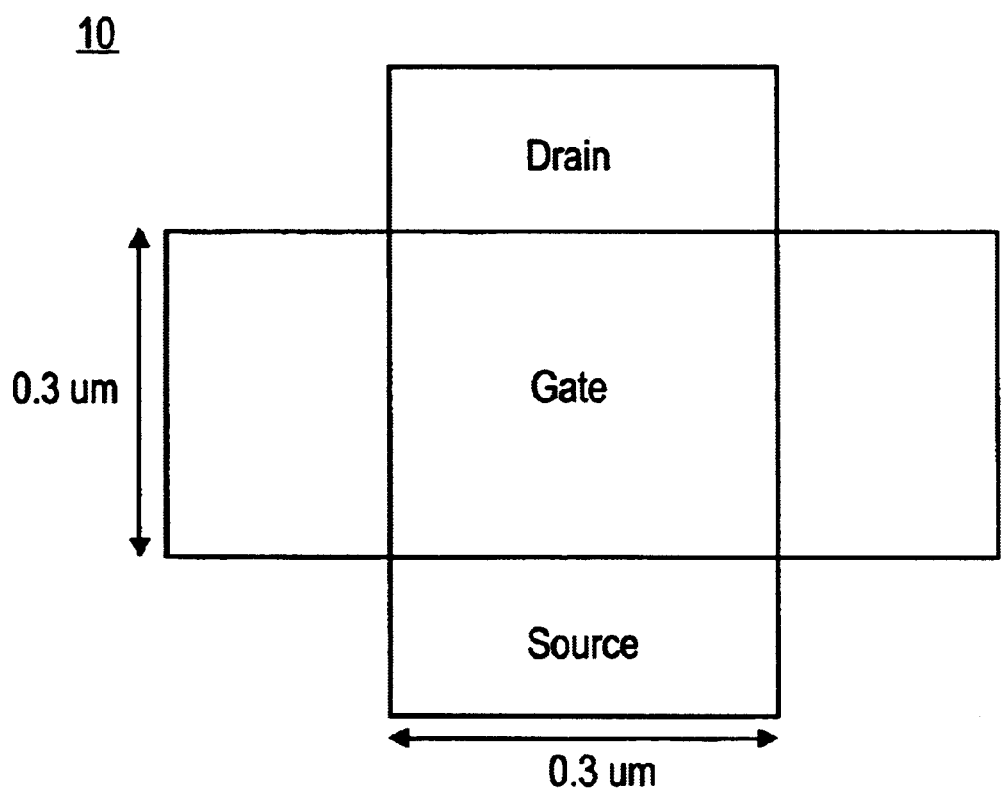
FIG. 1 shows a standard flash memory cell.
Figure 2:
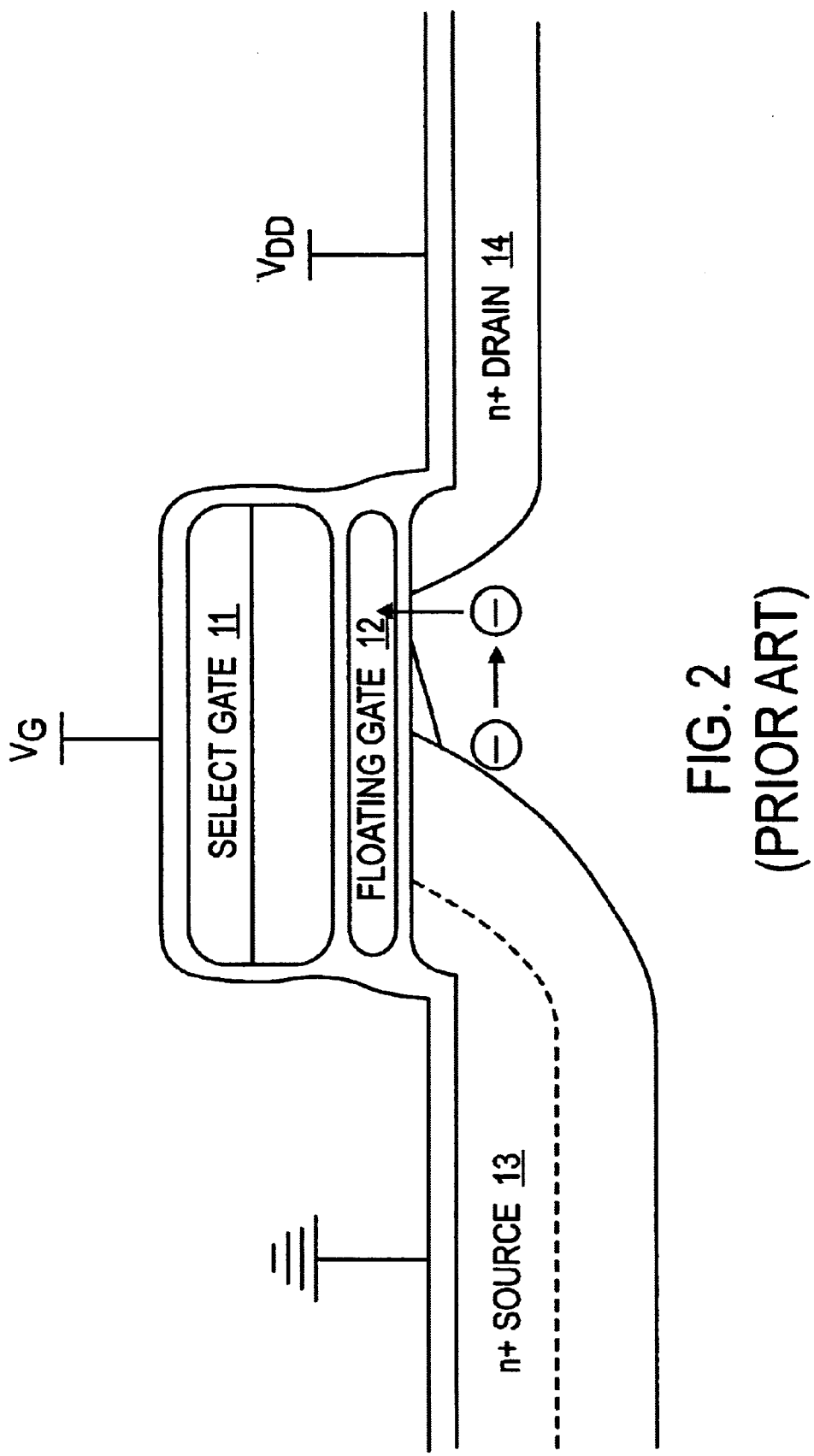
FIG. 2 shows a flash memory cell configured for programming.

On top of the vertical diffusion layers 39 is a second level polysilicon layer with the floating gate (not shown in FIG. 4) being sandwiched in between. The floating gate is routed in a first level polysilicon layer. In the present process, the first level polysilicon layer is not physically drawn. It is self-aligned and determined indirectly through diffusion and the second level polysilicon layer. As a result, between the vertical diffusion stripes are horizontal bars of diffusion, which extend and short the first level vertical polysilicon lines together. All the first level polysilicon is shared throughout the large flash memory cell 30A meaning there is only one floating gate. The auxiliary devices 31–38 have their floating gates shared with the large flash memory cell 30A as well. The second level polysilicon layer forms the select gate 11. Note that both the select gate 11 and floating gate 12 are depicted in FIG. 2. The charges are passed from one polysilicon layer to the next through a tunnel oxide.

Figure 5:
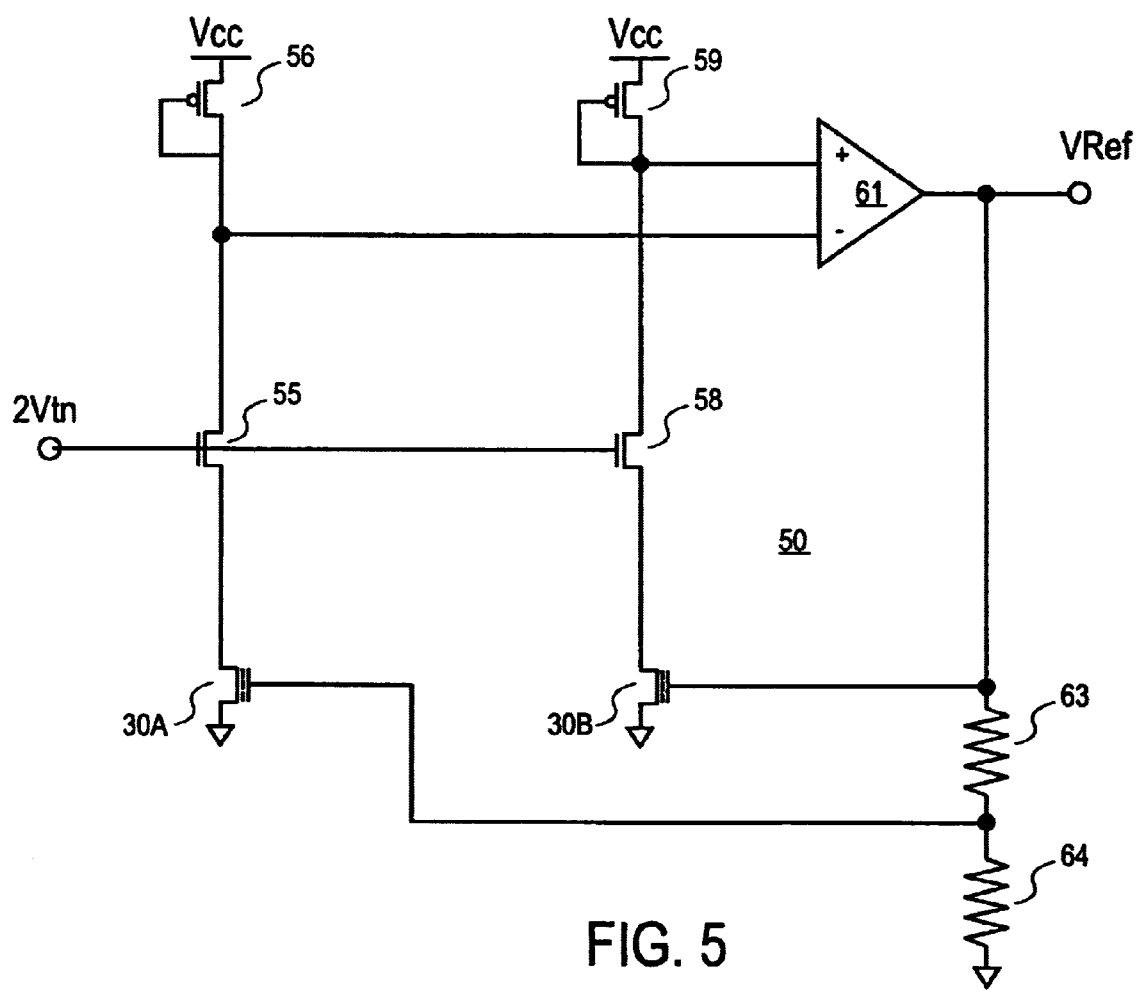
FIG. 5 shows a basic circuit diagram of a voltage reference generator.

FIG. 5 shows a basic circuit 50 of a reference voltage generator. A standard reference voltage generator implementation includes the use of two standard minimally sized flash memory cells 10. The circuit 50 includes a pair of flash memory cells 30A and 30B, each having a different charge value. The flash device 30A has its source and drain terminals connected in series with the source and drain terminals of an N type field effect transistor device 55 and the source and drain terminals of a P type field effect transistor device 56. The P type device 56 has its gate terminal connected to its drain terminal so that it functions like a resistor. The N type device 55 is a cascode device used to maintain the voltage at the drain terminal of the flash device 30A at a voltage which is a threshold voltage Vt below the gate voltage of the cascode device 55.

The flash device 30B has its source and drain terminals connected in series with the source and drain terminals of an N type field effect transistor device 58 and the source and drain terminals of a P type field effect transistor device 59. The P type device 59 is sized identically to the P type device 56 and has its gate terminal connected to its drain terminal so that it also functions like a resistor. The N type device 58 is a cascode device identical to the cascode device 55 and is also used to maintain the voltage at the drain terminal of the flash device 30B at a voltage which is a voltage Vt below the gate voltage of the cascode device 58.

The drain terminal of the P device 56 is connected to the negative input of a sensing amplifier 61 while the drain terminal of the P device 59 is connected to the positive input of the sensing amplifier 61. The amplifier 61 provides an output potential at a terminal which may be measured above the ground potential across a pair of resistors 63 and 64. The voltage at the output terminal of the sensing amplifier is the reference voltage controlled by the circuit 50. The resistor 63 is one-half the value of the resistor 64 in one embodiment of the invention.

Because the resistor 63 is one-half the value of the resistor 64, the voltage difference between the output terminal and ground divides so that the gate of the flash device 30A receives two-thirds of the voltage which the gate of the flash device 30B receives. During manufacturing, each of the flash devices is programmed to hold a different charge on its floating gate. The values of the charges are selected such that when the circuit 50 is in equilibrium providing the desired output value to be used as a reference voltage, the currents through the two flash devices are equal, the voltages across the capacitors formed by the floating gates and the fields of each flash device are equal, and the drain voltages are equal. In this condition, the gate voltages provided by the resistor divider network of resistors 63 and 64 are just appropriate to maintain the equal current through the two devices 30A and 30B. This means that the threshold voltage Vt of the device 30B is greater than the threshold voltage Vt of the device 30A, and this is in fact the way in which the devices 30A and 30B are programmed so that when the voltage at the gate of the device 30A is two-thirds that of the voltage at the gate of the device 30B, equal currents are produced.

If the output reference voltage shifts, this must be because the current through one of the two flash devices has changed. For example, if the current through the device 30A increases, then the current through and the voltage across the device 56 also increases. This lowers the level of the voltage at the drain of the device 56 and at the negative input of the amplifier 61. This applies a larger voltage across the differential inputs to the sensing amplifier 61 and causes a positive change, an increase, in the output voltage of the amplifier 61. This, in turn, will raise the voltage level at the gate terminals of the flash devices 30A and 30B. The voltage at the gate terminal of the device 30B is changed by a proportionally greater amount than is the gate terminal of the device 30A. This increased gate voltage increases the current through the flash device 30B and the P device 59 thereby lowering the voltage at the drain terminal of the device 59 and at the positive input to the amplifier and counteracting the original increase in current through the device 30A. A change in another sense through either of the devices 30A or 30B will have a similar effect in balancing the current and maintaining the output voltage at the steady reference voltage output.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A reference voltage generator comprising:

a first nonvolatile memory cell; and a first plurality of threshold voltage tuning devices coupled to the first nonvolatile memory cell, wherein the first plurality of threshold voltage tuning devices are configured to improve programmability of the first nonvolatile memory cell.

2. The reference voltage generator in claim 1, wherein the first nonvolatile memory cell is a flash memory cell.

3. The reference voltage generator in claim 1, wherein the first plurality of threshold voltage tuning devices comprise eight threshold voltage tuning devices.

4. The reference voltage generator in claim 1, wherein the first nonvolatile memory cell further comprises:

a source;

a drain;

a floating gate;

a select gate, wherein the gates have a length that is greater than approximately 5 microns.

5. The reference voltage generator in claim 1, wherein the first plurality of threshold voltage tuning devices are coupled to the first nonvolatile memory cell by a floating gate.

6. The reference voltage generator of claim 1, wherein the first plurality of threshold voltage tuning devices, each further comprise:

a source;

a drain;

a floating gate, a select gate, wherein the gates have a length that is less than about 5 microns.

7. A reference voltage generator, comprising:
a first nonvolatile memory cell coupled to a first plurality of threshold voltage tuning devices; and
a second nonvolatile memory cell coupled to the first nonvolatile memory cell, and to a second plurality of threshold voltage tuning devices.

8. The reference voltage generator of claim 7, wherein the second nonvolatile memory cell is a flash memory cell.

9. The reference voltage generator of claim 7, wherein the second plurality of threshold voltage tuning devices each further comprise:
a source;
a drain;
a floating gate;
a select gate; wherein the gates have a length that is less than approximately 5 microns.

10. The reference voltage generator of claim 7, wherein the second plurality of threshold voltage tuning devices are coupled to the second nonvolatile memory cell by a floating gate.

11. The reference voltage generator of claim 7, wherein the first plurality of threshold voltage tuning devices include gates that have gate lengths that are approximately equal in dimension to gate lengths of the second plurality of threshold voltage tuning devices.

12. The reference voltage generator of claim 7, wherein the first nonvolatile memory cell and the first plurality of threshold voltage tuning devices are coupled to the second nonvolatile memory cell and the second plurality of threshold voltage tuning devices by cascode devices and resistors.

13. A nonvolatile memory device, comprising:
a first nonvolatile memory cell coupled to a first plurality of threshold voltage tuning devices;
a second nonvolatile memory cell coupled to a second plurality of threshold voltage tuning devices; and
an array of memory cells coupled to the first and second nonvolatile memory cell.

14. The nonvolatile memory device of claim 13, wherein the first nonvolatile memory cell and the second nonvolatile memory cell are coupled to the array of memory cells by a decoder and sensing circuit.

15. The nonvolatile memory device of claim 13, wherein each memory cell within the array is about at least approximately ten times smaller than the first nonvolatile memory cell and the second nonvolatile memory cell.

* * * * *